United States Patent [19]

Kim

[11] Patent Number: 5,356,838

[45] Date of Patent: Oct. 18, 1994

[54] MANUFACTURING METHOD OF A SEMICONDUCTOR DEVICE

[75] Inventor: Gu Sung Kim, Suwon, Rep. of Korea

[73] Assignee: Samsung Electronics Co., Ltd., Suwon, Rep. of Korea

[21] Appl. No.: 140,826

[22] Filed: Oct. 25, 1993

[30] Foreign Application Priority Data

Jan. 13, 1993 [KR] Rep. of Korea .................. 1993-349

[51] Int. Cl.⁵ ..................................... H01L 21/302
[52] U.S. Cl. ................................. 437/226; 437/227; 437/182; 437/183
[58] Field of Search ............... 437/226, 227, 220, 182, 437/183; 148/DIG. 28; 257/773, 735, 736, 737, 738

[56] References Cited

U.S. PATENT DOCUMENTS

| | | | |
|---|---|---|---|
| 4,930,216 | 6/1990 | Nelson | 437/226 |
| 4,984,358 | 1/1991 | Nelson | 437/226 |
| 5,094,970 | 3/1992 | Yoshida et al. | 437/226 |
| 5,126,286 | 6/1992 | Chance | 437/227 |
| 5,136,354 | 8/1992 | Morita et al. | 437/226 |
| 5,157,588 | 10/1992 | Kim et al. | 361/396 |
| 5,186,381 | 2/1993 | Kim | 228/123 |
| 5,199,164 | 4/1993 | Kim et al. | 257/712 |
| 5,223,454 | 6/1993 | Uda et al. | 437/183 |

*Primary Examiner*—Tom Thomas
*Assistant Examiner*—Kevin M. Picardat
*Attorney, Agent, or Firm*—Cushman, Darby & Cushman

[57] ABSTRACT

A method of manufacturing and a structure of a semiconductor device has an I/O terminal whereby when individual semiconductor chips are separated from the semiconductor wafer manufactured according to this invention, the terminals are exposed on the edges of the semiconductor chip allowing for the interconnection of the terminals when the semiconductor chips are stacked. The bump electrode is formed using metal masks and magnets by mounting a solder ball on an aperture of a first mask to form the solder bump on an electrode pad provided on a semiconductor wafer. A conductive material forms a conductive pattern between the solder bumps of the individual semiconductor chips using an aperture of a second mask. The individual semiconductor chips which are separated from the semiconductor wafer are then easily stacked and packaged by use of the I/O terminals on the sides of the individual semiconductor chips.

16 Claims, 3 Drawing Sheets

MANUFACTURING METHOD OF A SEMICONDUCTOR DEVICE

FIELD OF THE INVENTION

The present invention relates to a method of manufacture and a structure of a semiconductor device. More particularly, it relates to a semiconductor wafer structure having a bump terminal formed of a conductive pattern whereby when the individual semiconductor chips are separated from the semiconductor wafer, the bump terminals are exposed on the edges of the semiconductor chip allowing for stacking of the semiconductor chips into a three dimensional device.

BACKGROUND OF THE INVENTION

The development of semiconductor devices has led to single packaged devices having more functionality, higher pin counts, higher speed, and higher reliability. The development of LSI devices has also created a demand for the use of surface mount technology when packaging semiconductor devices.

A focus has been placed on embodying the semiconductor devices within thin packages having many leads with a very small spacing between the leads. To satisfy these requirements, thin quad-flat packages (TQFPs), thin small-outline packages (TSOPs) and TAB packages have become promising approaches.

The TQFP and TSOP packages can be implemented into a manufacturing facility using equipment from older package assembly processes, while the conventional TAB package requires more updated processing equipment at the manufacturing facility. To reduce the need for this new equipment by utilizing old equipment, a solder bump technique was developed to replace the wire in the TAB process.

Different from the wire bonding technique, the bump technique involves the formation of a metal projection from the semiconductor chip which allows a pad on it to be connected to a lead frame of a tape automated bonding (TAB) package without the use of bonding wire. The solder bump contacts the lead frame directly and therefore performs the function of the wire.

A TAB package is a conventional surface mount bonding technique in which a metal bump is formed on the surface of a semiconductor chip and utilized to bond the terminals of the semiconductor chip to a metal tape incorporated with a copper pattern to function as a lead frame and wires. The TAB technique is a more advanced connection technique because it directly bonds a single LSI circuit to the lead frame without the use of wire.

Three conventional methods for the interconnection of stacked thin packages are disclosed in the report of the "ISHM 92 Proceedings" respectively entitled: "3D Stacking of TSOP Plastic Packages" pp. 370 375; "Development of Solder Bump Fabrication in Multi-chip Modules" pp. 315 and 316, Japan; and "Development of Automatic High-density Solder Ball Mounter, page 93, Japan.

According to the first conventional method disclosed, a wafer fabrication technique is used to make a terminal through a desired portion of the semiconductor chip. Evaporation, photolithography and subsequent etching processes form a metal projection on a semiconductor chip pad located on the periphery of a semiconductor chip.

The second method disclosed attaches a bumped semiconductor chip to a film carrier, using a TAB package. The TAB package is connected to a solder bump placed on the pads at the sides of a semiconductor chip.

In the third method disclosed, a semiconductor chip is attached to a film carrier. The semiconductor chips are then stacked and wire bonded together. After this unit is adhered by an adhesive epoxy, the resulting structure is encapsulated via a potting or molding technique. Then, the wire-bonded portion is cut by means of a diamond blade apparatus to form the wire bonding terminals.

However, the above-described conventional methods for manufacturing the semiconductor devices have the disadvantages of necessitating a more complicated manufacturing process and an increased investment in manufacturing equipment due to the need for the use of a photolithography process or a tape carrier. The conventional methods also contribute to a significant cost for the manufacture of the semiconductor devices.

SUMMARY OF THE INVENTION

Therefore, it is an object of the present invention to provide a method which provides a less expensive formation of a semiconductor chip having an accessible bump terminal for stacking.

It is another object of the present invention to provide a manufacturing method for a semiconductor device which connects a bump electrode to a semiconductor chip using a metal mask.

It is a further object of the present invention to provide a manufacturing method for a semiconductor device capable of easily forming I/O terminals on the periphery of a semiconductor chip.

To achieve these and other objects of the present invention, there is provided a manufacturing method whereby an electrode pad and a passivation layer are formed on a semiconductor wafer substrate. The passivation layer has an opening formed to expose the electrode pad. A barrier metal layer is formed on the exposed electrode pad to protrude from the passivation layer to form a bump electrode. The semiconductor wafer is placed on a magnet and a metal mask pattern is used to put a solder ball on the barrier metal layer, forming solder bumps. The semiconductor wafer is placed back on the magnet and another metal mask pattern is used to coat a conductive paste onto the resultant structure. The conductive paste forms a conductive pattern across the scribe lines of a semiconductor wafer, so that when the individual semiconductor chips are separated from the semiconductor wafer, portions of the conductive pattern become exposed at the edges of the semiconductor chip. A protection layer of molded resin is then formed on the resultant surface to protect the conductive pattern.

Therefore, the I/O terminals of the semiconductor chip manufactured according to the present invention can be accomplished using two metal masks. The solder bumps formed by the use of the two metal masks are inexpensive in comparison to the herebefore conventional processes which comprise photolithography, sputtering, and electro-plating.

The present invention has the advantages of saving manufacturing cost, of minimizing installed investment, and of simplifying the manufacturing processes over those conventionally known.

BRIEF DESCRIPTION OF THE DRAWINGS

The above objects and other advantages of the present invention will become more apparent by the detailed description of the preferred embodiments thereof with reference to the attached drawings, in which.

DETAILED DESCRIPTION OF THE PREFERRED EMBODIMENTS

Figure 1A:
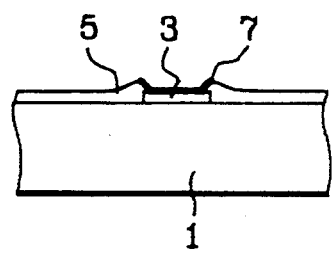
FIGS. 1A to 1G show steps of a method of manufacturing a semiconductor wafer having a bump electrode according to a preferred embodiment of the present invention.

Referring to FIG. 1A, an electrode pad 3 is formed on a predetermined portion of a semiconductor wafer 1. The electrode pad 3 is formed of a metal layer, i.e., of aluminum (Al), or an aluminum alloy, which is stacked on the semiconductor wafer 1 and patterned by etching.

A passivation layer 5 is then coated on the semiconductor wafer 1 and the electrode pad 3. The semiconductor wafer 1 may be an individual semiconductor chip or it may be a wafer forming many semiconductor chips.

A photoresist layer is then coated on the passivation layer 5 and patterned using a conventional lithography process. Using the photoresist pattern as a mask, the passivation layer 5 is removed by a conventional etching process to expose the electrode pad 3. This forms an opening 7 on the electrode pad 3. The photoresist pattern is thereafter removed.

The semiconductor wafer 1 having the exposed electrode pad 3 thereon is then cleaned with de-ionized water. An oxide layer on the electrode pad 3 is then removed using a hydrofluoride (HF) solution.

An activation layer is then formed on the electrode pad 3 for plating. The semiconductor wafer 1 is treated with a mixture obtained by dissolving palladium chloride (PdCl12) powder in a hydrochloric acid (Hcl). The activation process by the palladium (Pd) is carried out by mixing 100 mg/l of PdCl12 and 1 ml/l of Hcl under a room temperature for 6 seconds.

Figure 1B:
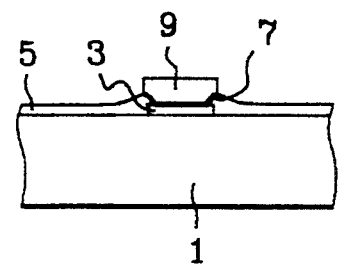

After exposing the electrode pad 3 as shown in FIG. 1A, a barrier metal layer 9 is formed on the electrode pad 3. The barrier metal layer 9 is formed to protrude through the opening 7 in the passivation layer 5 on the semiconductor wafer 1 as shown in FIG. 1B. Nickel (Ni) is plated on the electrode pad 3 using an electrolysis-plating method. An annealing is carried out to increase the hardness of the barrier metal layer.

A flux is coated on the semiconductor wafer 1, and the resultant structure is thermally treated at a temperature of 90° C. for 20 minutes. The flux functions as a catalyzer for promoting a chemical reaction. The flux is a requisite material while the metals react to each other, but it is unnecessary once the reaction is completed. Also, in order to perfectly maintain the solder joint and prevent a chemical deterioration, the flux should be removed. Accordingly, the flux which is left on the semiconductor wafer 1 must be eliminated by cleaning.

Figure 1C:
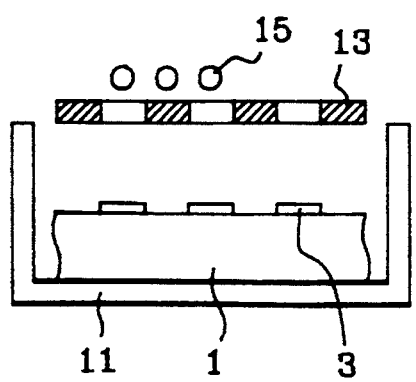

Referring to FIG. 1C, the semiconductor wafer 1 is then placed on a magnet 11. The aperture of a first metal mask 13 is aligned over the electrode pad 3 to expose the barrier metal layer 9. A prepared solder ball 15 is rolled to be placed over the electrode pad 3 of the semiconductor wafer 1.

Figure 1D:
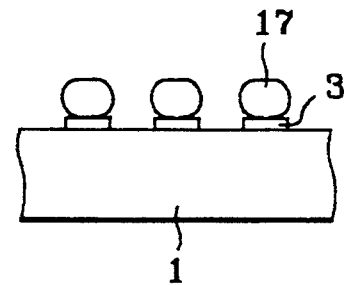

FIG. 1D shows the solder ball 15 after it is reflowed into a circular solder bump 17 on the electrode pad 3.

Figure 1E:
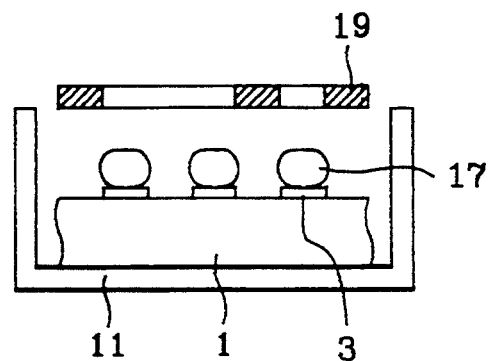

The semiconductor wafer 1 having the solder bump 17 on the electrode pad 3 is then replaced on the magnet 11 as shown in FIG. 1E. The aperture of a second metal mask 19 is aligned over the solder bump 17 to form a conductive pattern of the solder bump between elements using a screen printing process.

Figure 1F:
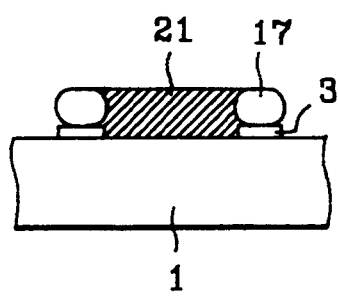

Referring to FIG. 1F, the conductive pattern is printed using a conductive paste material 21. In the preferred embodiment, the conductive paste is silk-screened. Therefore, the conductive paste may be any silkcreenable or otherwise printable material, e.g., a silver paste. The conductive paste forms the I/O terminals. The conductive paste 21 is dried prior to curing.

Figure 1G:
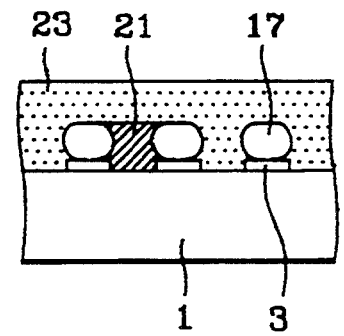

FIG. 1G shows a protection layer 23 of a moldable polyimide resin formed on the surface of the resultant structure to protect the conductive pattern.

Figure 2:
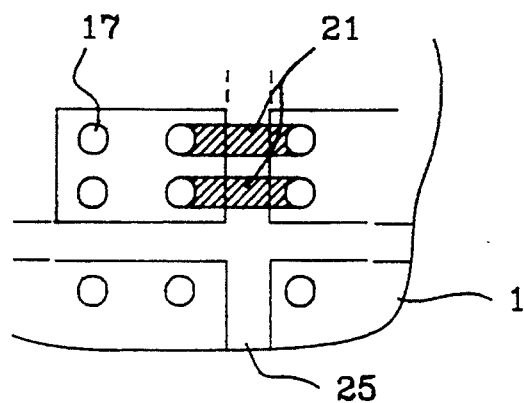
FIG. 2 is a plan view showing the semiconductor wafer according to a preferred embodiment of the present invention after performing the steps of FIG. 1F.

FIG. 2 is a plan view showing the semiconductor wafer 1 after performing the steps shown in FIG. 1F. The conductive pattern is formed on a scribe line 25 between two simultaneously formed semiconductor chips 27 from a single semiconductor wafer 1.

Figure 3:
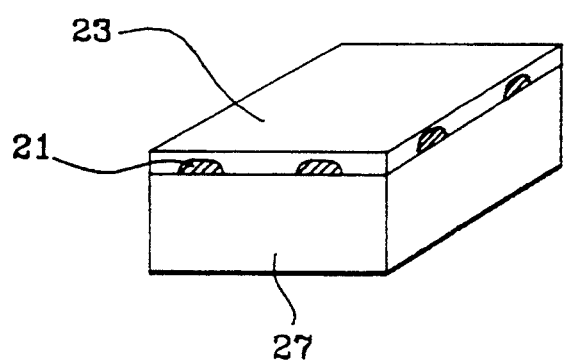
FIG. 3 is a perspective view showing the semiconductor chip obtained according to a preferred embodiment of the present invention.

A perspective view of the completed semiconductor chip 27 is shown in FIG. 3.

Figure 4:
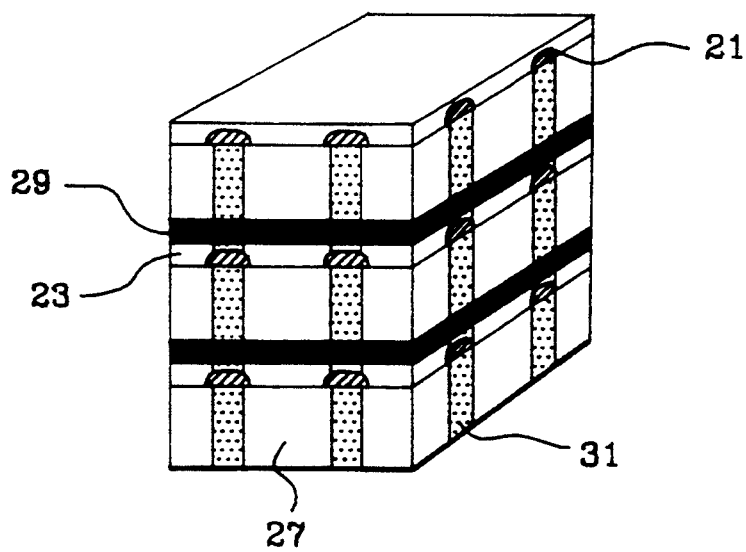
FIG. 4 is a perspective view showing three stacked semiconductor chips adhered together after being removed from the semiconductor wafer manufactured according to a preferred embodiment of the present invention.

FIG. 4 shows a plurality of semiconductor chips 27 stacked with interposing adhesive epoxy 29. The semiconductor chips 27 are connected via a vertical metal pattern 31 to form a stacked semiconductor package. The vertical metal pattern 31 may be connected using a vacuum technique to generally employ the conductive pattern of conductive paste 21.

The semiconductor chips 27 shown in FIG. 4 have common outputs in common locations relative to the semiconductor chip 27. For instance, the semiconductor chips 27 are Random Access Memory (RAM) or Read Only Memory (ROM) chips which are stacked to achieve a higher capacity in single packaged device.

The present invention is equally advantageous when used to interconnect semiconductor chips 27 not having common output locations, and it will be understood to those skilled in the art that various configurations of the vertical metal pattern 31 can be used to interconnect semiconductor chips using the present invention.

It will also be understood by those skilled in the art that various changes in form and details may be effected herein without departing from the spirit and scope of the invention as defined by the appended claims.

What is claimed is:

1. A method of manufacturing a semiconductor device comprising the steps of:
   disposing a conductive paste between a first and a second solder bump, said first and second solder bumps being disposed on a first and a second electrode of a semiconductor substrate, respectively;
   forming a protective layer over said conductive paste, said first and second solder bumps, said first and second electrodes, and said semiconductor substrate;

scribing a line on said protective layer across said conductive paste; and separating said semiconductor substrate along said scribe line to expose a portion of said conductive paste associated with each solder bump.

2. The method of manufacturing a semiconductor device according to claim 1, wherein:

a first and a second semiconductor chip are formed on said semiconductor substrate;

wherein said first solder bump and said first electrode are associated with said first semiconductor chip, and said second solder bump and said second electrode are associated with said second semiconductor chip.

3. The method of manufacturing a semiconductor device according to claim 1, wherein a passivation layer is formed on said semiconductor substrate surrounding said first and second electrodes.

4. The method of manufacturing a semiconductor device according to claim 1, wherein a first barrier metal layer is formed between said first solder bump and said first electrode.

5. The method of manufacturing a semiconductor device according to claim 1, wherein said semiconductor substrate is in a wafer state.

6. The method of manufacturing a semiconductor device according to claim 1, wherein said first and second electrodes are formed by the steps of:

forming a metal layer on said semiconductor substrate, said metal layer comprising aluminum; and etching said metal layer to obtain a predetermined pattern of said first and second electrode.

7. The method of manufacturing a semiconductor device according to claim 4, wherein a passivation layer is formed on said semiconductor substrate to surround said first and second electrodes; and said barrier metal layer is formed to protrude from an opening formed in said passivation layer.

8. The method of manufacturing a semiconductor device according to claim 4, wherein said barrier metal layer is formed by an electrolysis-plating of a metal material.

9. The method of manufacturing a semiconductor device according to claim 8, wherein said barrier metal material is selected from a group consisting of Pd/Ni, Cr/Cu, TiW/Cu, and Au.

10. The method of manufacturing a semiconductor device according to claim 4, including the steps of:

a flux is coated on said first and second barrier metal layers before said first and second solder bumps are formed thereon; and thermally treating said semiconductor substrate at a temperature of about 90° C. for about 20 minutes.

11. The method of manufacturing a semiconductor device according to claim 1, wherein said first and second solder bumps are formed by the steps of:

placing a first and second solder ball on said first and second electrodes, respectively; and reflowing said first and second solder balls to form said first and second solder bumps.

12. The method of manufacturing a semiconductor device according to claim 1, wherein said conductive paste is formed using a screen printing process.

13. The method of manufacturing a semiconductor device according to claim 1, wherein said conductive paste is comprised of silver.

14. The method of manufacturing a semiconducting device according to claim 1, wherein said protective layer is formed of polyimide resin.

15. The method of manufacturing a semiconducting device according to claim 1, including the step of contacting a conductive lead to said exposed portion of said conductive paste.

16. The method of manufacturing a semiconducting device according to claim 15, wherein said step of contacting said conductive lead to said exposed conductive paste is performed in a vacuum.

* * * * *